United States Patent [19]

Choma, Jr.

[11] Patent Number: 4,468,629

[45] Date of Patent: Aug. 28, 1984

[54] NPN OPERATIONAL AMPLIFIER

[75] Inventor: John Choma, Jr., Hacienda Heights, Calif.

[73] Assignee: TRW Inc., Redondo Beach, Calif.

[21] Appl. No.: 363,364

[22] Filed: May 27, 1982

[51] Int. Cl.³ .......................... H03F 3/45; H03F 1/42
[52] U.S. Cl. ...................................... 330/260; 333/217
[58] Field of Search ...................... 330/69, 93, 95, 254, 330/260; 333/213, 216, 217; 307/291

[56] References Cited

U.S. PATENT DOCUMENTS

| | | |
|---|---|---|
| 3,351,865 | 11/1967 | Dow et al. |
| 3,390,344 | 6/1968 | Squires et al. |
| 3,414,831 | 12/1968 | Wilson |
| 3,619,797 | 11/1971 | Merrick |
| 3,684,973 | 8/1972 | Duck |
| 3,851,270 | 11/1974 | Vosteen |
| 4,216,436 | 8/1980 | Lefferts ............................ 330/257 X |

Primary Examiner—James B. Mullins
Assistant Examiner—Steven J. Mottola
Attorney, Agent, or Firm—Robert M. Wallace; Noel F. Heal

[57] ABSTRACT

An operational amplifier having an extremely high gain-bandwidth product. The amplifier includes a gain cell with an active negative resistance circuit made up of two matched NPN transistors (18 and 20) with their bases cross-connected to their collectors, and with a differential pair of NPN transistors (14 and 16) having their emitters degenerated through the active negative resistance circuit. The value of the negative resistance is chosen to negate other resistance values in the denominator of a fraction expressing overall amplifier gain, which is therefore maximized. Since no PNP transistors are needed to maximize gain in the amplifier, NPN transistors can be used exclusively, and the amplifier can be more conveniently fabricated in integrated-circuit form, with a desirably wide bandwidth.

10 Claims, 3 Drawing Figures

NPN OPERATIONAL AMPLIFIER

The government has rights in this invention pursuant to Contract No. N00123-77-C-1045 awarded by the Department of the Navy.

BACKGROUND OF THE INVENTION

This invention relates generally to operational amplifiers, and, more specifically, to operational amplifiers having not only a very high gain, but also a very broad bandwidth. The term operational amplifier was originally introduced by workers in the analog computer field to denote an amplifier circuit for performing various mathematical operations, such as integration, differentiation, summation and subtraction. In these circuits, the required response is obtained by the application of negative feedback to a high gain direct current (dc) amplifier, by means of components connected between amplifier input and output terminals in a manner referred to as "operational feedback." The term operational amplifier is now more generally used to designate any high performance amplifier suitable for use with this type of feedback. Operational amplifiers are used not only in analog computation systems, but also in a wide range of other applications in such fields as instrumentation and control system engineering.

On a theoretical level, an ideal operational amplifier has the characteristics of infinite gain between the input and output terminals; infinite input impedance, so that no current flows into the input terminals; zero output impedance, so that the amplifier is unaffected by changes in electrical load coupled to the output terminals, and an infinite bandwidth, i.e. a bandwidth extending from zero to infinity to insure both a response to dc signals and an instantaneous response to change all types of input signal. Another characteristic of the ideal amplifier is that the output voltage signal will be zero when the input signal is zero, regardless of the nature of the input source. This charcteristic is called a zero offset.

In a practical operational amplifier, neither the amplifier gain nor the bandwidth is infinite. One measure of the performance of a practical amplifier is the product of the gain and the bandwidth, which is usually expressed as the frequency at which the gain falls to a value of unity. The best operational amplifiers prior to this invention have unity gain frequencies typically of around one megahertz (MHz), with a few devices providing a unity gain frequency as high as 200 MHz. There is need in some application areas, however, for an amplifier with a unity gain frequency in the range 800 MHz to 1.5 gigahertz (GHz).

The only practical way to provide a very high gain in an amplifier employing bipolar transistors is to provide a large load resistance in the collector circuit of at least one stage of the amplifier. However, simply providing a passive resistance of some hundreds of thousands of ohms in the collector circuit results in unacceptably large voltage drops, and is therefore impractical. The solution employed in operational amplifiers of the prior art is to include an active current source, rather than a passive resistance in the collector circuit. The active current source provides a practically infinite resistance but still conducts a finite current and requires only a small voltage to sustain it. In operational amplifiers, the only practical way of providing such an active current source is by means of a PNP transistor. All operational amplifiers of the prior art have followed this approach, which has two significant drawbacks.

First, in many processes used for the fabrication of monolithic operational amplifiers, i.e. amplifiers formed as a single integrated circuit, it is extremely difficult to control the characteristics of both PNP and NPN transistors simultaneously in the same process. Typically, the NPN devices yield the desired characteristics of high gain and bandwidth, but the PNP transistors tend to have only a moderate gain and an unacceptably low bandwidth. Consequently, the composite amplifier has only moderately good performance characteristics. Secondly, regardless of the fabrication process used, even the most successful operational amplifiers employing PNP transistors to provide a large collector resistance have only moderately high frequency at unity gain, typically in the range of one to two MHz.

It will be appreciated from the foregoing that there is a significant need in the operational amplifier field for an amplifier capable of providing unity gain frequency in excess of one GHz. The present invention fulfills this need.

SUMMARY OF THE INVENTION

The present invention resides in an operational amplifier comprised of only NPN transistors and employing a novel negative resistance cell to provide a high gain and an extremely wide bandwidth. More specifically, the amplifier of the invention includes a two-stage differential pair amplifier, of which the second stage is emitter degenerated in an active negative resistance.

The novelty of the invention may be alternatively defined in terms of the radically different approach that is taken for maximizing gain. Reduced to its simplest terms, the gain of an operational amplifier stage may be expressed mathematically as the quotient obtained by dividing a numerator expression by a denominator expression. The numerator expression is dominated by the collector resistance term, and previous efforts to maximize gain have always focused on the maximization of this term.

In the amplifier of the present invention, however, the denominator of the gain expression, which includes the sum of a number of resistance terms, is minimized by making one of the resistance terms negative, and hence the denominator itself as close as possible to zero. Since the denominator of the gain expression is minimized, the gain itself is maximized. Moreover, the device has an extremely wide bandwidth, and a unity gain frequency in excess of one gigahertz.

Briefly, and in general terms, the basic gain cell of the invention includes a first pair of NPN transistors connected as a differential amplifier pair and having an input signal applied across the bases of the transistors, and a second differential pair of NPN transistors having an input signal applied across its bases and derived from the collectors of the first differential pair, and having its output signal taken in cascode from the collectors of the second differential pair. The emitters of the first differential pair of transistors are tied together directly, as is conventional, but in accordance with the invention the emitters of the second stage differential pair are connected to an active negative resistance circuit.

In accordance with an important aspect of the invention, the active negtive resistance circuit is provided by a simple cross-connection of two additional matched NPN transistors. The collectors of these transistors are connected to respective emitters of the second-stage differential pair of transistors, and the emitters of the negative resistance transistor pair are coupled together to a common current source. The bases of the two matched transistors are cross-coupled to the collectors. As viewed from the emitters of the second differential pair of transistors, the impedance of the negative resistance circuit is determined in part by the negative of the internal emitter resistance of the transistors making up the circuit. Since the emitter resistance is accurately controllable during fabrication of the device, the negative resistance circuit of the invention provides an extremely stable resistance unaffected by variations in either frequency or voltage level. Consequently, the resulting gain of the basic gain cell is very high over a wide range of frequencies and voltage conditions.

A complete operational amplifier in accordance with the invention utilizes one or more of the basic gain cells employing the negative resistance circuit as described. The basic gain cell has a minor disadvantage in that it has a characteristically high output resistance. However, this factor can be taken care of by means of a conventional impedance buffer to transform the high impedance of the circuit to a desirably low output impedance. Subsequently, conventional operational amplifier stages may be used to provide additional amplification, or additional basic gain cells employing negative resistance circuits could be employed.

It will be appreciated from the foregoing that the present invention represents a significant advance in the field of operational amplifiers. In particular, it provides an operational amplifier having extremely high bandwidth as well as large gain. Other aspects and advantages of the present invention will become apparent from the following more detailed description, taken in conjunction with the accompanying drawings.

DESCRIPTION OF THE PREFERRED EMBODIMENT

Figure 1:
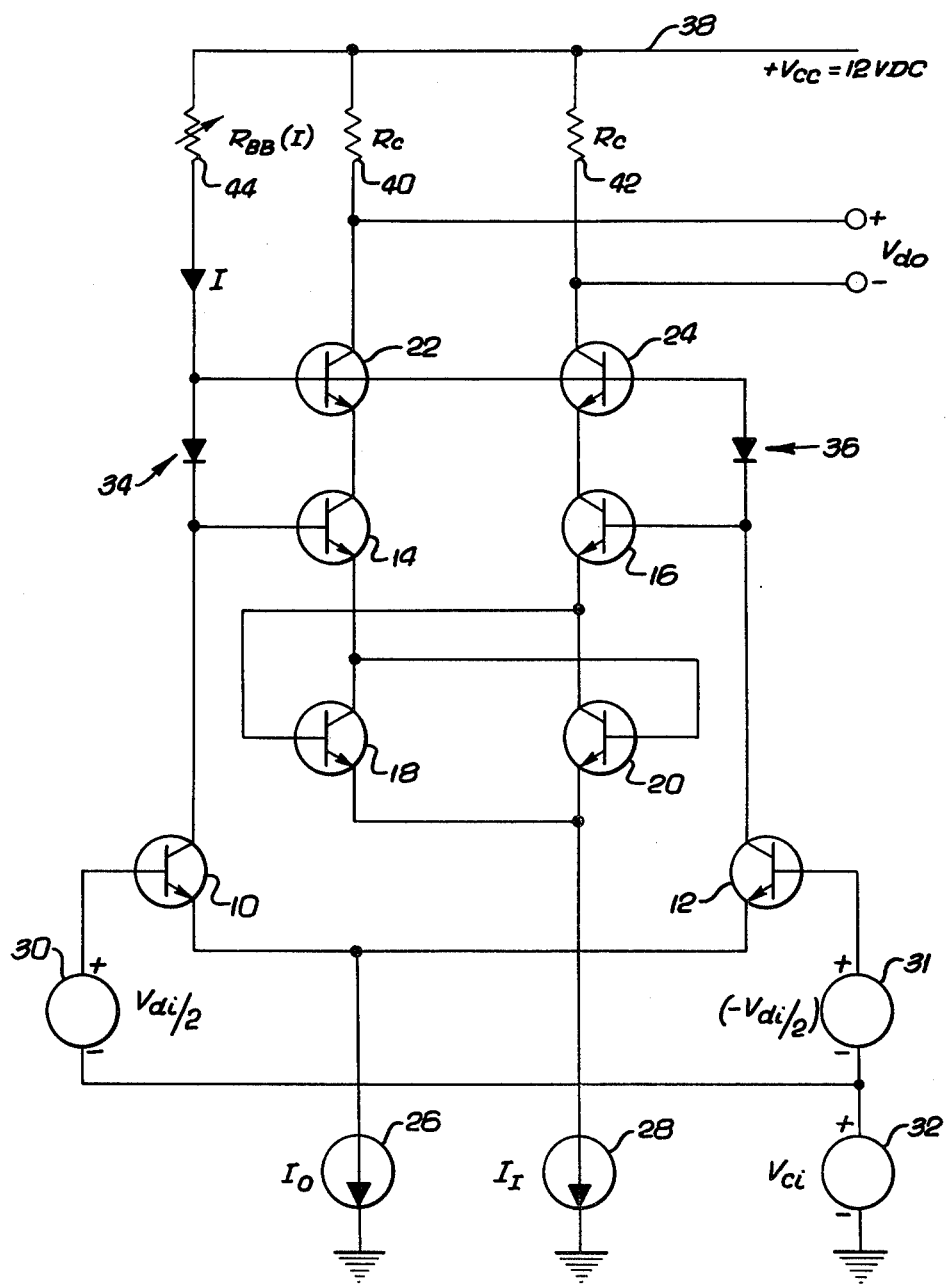
FIG. 1 is a simplified schematic view of a basic gain cell employed in the present invention.

As shown in the drawings for purposes of illustration, the present invention is concerned with an improved operational amplifier providing an extremely high gain-bandwidth product. An operational amplifier is basically a three-terminal device used in a variety of analog computation and control system circuit, principally as a direct-current (dc) amplifier of ideally infinite gain, and usually in conjunction with a negative feedback circuit. In many applications, it is also desirable to maximize not only the gain but also the bandwidth of the device. An ideal operational amplifier is responsive over a frequency range from zero to infinity, but of course, the ideal is never achieved in practice.

In prior operational amplifiers, gain is maximized by providing an extremely high collector resistance, usually in the form of an active current source. Amplifiers of this type employ PNP transistors as an active current source, and typically have only moderately high gain-bandwidth products. The gain-bandwidth product is usually expressed in terms of the frequency at which the amplifier gain falls to unity, or the "unit gain frequency." Amplifiers of the prior art have unity gain frequencies in the region of 1 megahertz (MHz), with a few devices providing a unity gain frequency up to 200 MHz.

In accordance with the present invention, an operational amplifier of very much higher unity gain frequency is provided, not by maximizing the collector resistance, but instead by emitter-degenerating a differential stage of the amplifier through an active negative resistance circuit. The resulting amplifier has a unity gain frequency in excess of one gigahertz (GHz), and possible as high as 1.5 GHz.

An operational amplifier usually has more than one amplifier stage or cell. The novelty of the present invention lies principally in the organization of a single gain cell, which may be used just once in conjunction with conventional gain stages, or may be used more than once in a single operational amplifier. The novel gain cell of the invention is referred to in this specification as the basic gain cell, and it is illustrated in FIG. 1.

As shown in FIG. 1, the basic cell comprising a first differential pair of NPN transistors, indicated by reference numerals 10 and 12, respectively, and a second differential pair of NPN transistors 14 and 16. The emitters of the second differential pair 14 and 16 are coupled to a negative resistance circuit made up of two additional NPN transistors 18 and 20. Yet another pair of NPN transistors 22 and 24 provide a conventional cascode common-base stage, to provide additional bandwidth compensation.

The specific details of device interconnection in the basic cell are as follows. The emitters of the first differential pair 10 and 12 are connected together to a current generator 26, and the emitters of the negative resistance pair 18 and 20 are connected to another current generator 28. The input terminals of the basic cell are the bases of the first differential pair 10 and 12. The input signals are shown diagrammatically in FIG. 1 as three voltage generators 30–32. Generators 30 and 31, each of half the input signal, are connected in series between the bases of transistors 10 and 12, and generator 32 is connected between ground and the junction between generators 30 and 31. Generator 31 represents a "common-mode" signal, i.e. a signal applied with the same polarity to both input terminals.

The collectors of the first differential pair of transistors 10 and 12 are connected to the bases of the second differential pair 14 and 16, respectively, and also, through diodes 34 and 36, respectfully, to the bases of transistors 22 and 24, the anodes of the diodes being connected to the bases of transistors 22 and 24. The collectors of transistors 22 and 24 are connected to a power supply line 38 through collector resistances 40 and 42, respectively. The power supply line 38 is also connected to the bases of transistors 22 and 24, through a variable resistor 44.

It is important to note that the emitters of the second differential pair of transistors 14 and 16 are not tied directly together, but are coupled to the respective collectors of transistors 18 and 20 in the negative resistance circuit. In addition, the bases of transistors 18 and 20 are cross-coupled to their collectors, i.e. the base of transistor 18 is connected to the collector of transistor 20 and the base of transistor 20 is connected to the collector of transistor 18. This cross-coupled pair of transistors constitutes a very stable negative resistance circuit. To appreciate the important contribution that this arrangement makes to the characteristics of the amplifier, it is necessary to consider the mathematical expression for the gain of the amplifier.

The differential mode gain of the basic amplifier cell may be derived using conventional equivalent circuit theory to yield the following expression:

$$A_{dm} = \frac{V_{do}}{V_{di}} = \left( \frac{\beta_{10} R_c}{r_{B10} + r_{\pi 10} + (\beta_{10} + 1) r_{e10}} \right) \times$$

$$\left( \frac{\beta_{14} R_{D34}}{R_{D34} + r_{B14} + r_{\pi 14} - (\beta_{14} + R_{EQ})} \right)$$

where: $\beta_j$ = the short-circuit current gain of transistor j,
$R_C$ = the load resistance 40 or 42,
$r_{Bj}$ = the internal base resistance of transistor j,
$R_j$ = the base-emitter junction diffusion resistance of transistor j,
$r_{ej}$ = the internal emitter resistance of transistor j,
$R_{D34}$ = the resistance of diode 34, and
$R_{EQ}$ = the equivalent resistance of the negative resistance circuit comprising transistors 18 and 20.

The equivalent resistance of the negative resistance circuit is given by the expression:

$$-R_{EQ} = - \left( \frac{r_{B18} + r_{\pi 18} + 2 r_{e18}}{\beta_{18} - 1} \right)$$

where the symbols have the same meanings as above.

It will be seen from the gain expression set forth above that the gain may be maximized by making the collector resistance as large as possible. This has been the traditional approach of the prior art. The novel approach of the present invention, however, is to minimize the denominator in the right-hand factor of the gain expression. Since this denominator is the sum of three fixed resistance parameters and an expression involving the equivalent negative resistance of the transistor pair 18 and 20, the denominator can be made to approach zero by an appropriate choice of negative resistance. Moreover, since the negative resistance is determined by accurately controllable transistor characteristics, primarily the internal emitter resistance, the negative resistance value can be determined in advance to a high degree of precision. An added benefit is that the value of the negative resistance is, for all practical purposes, independent of variations in frequency and voltage, and is also relatively insensitive to temperature variations.

Figure 2:
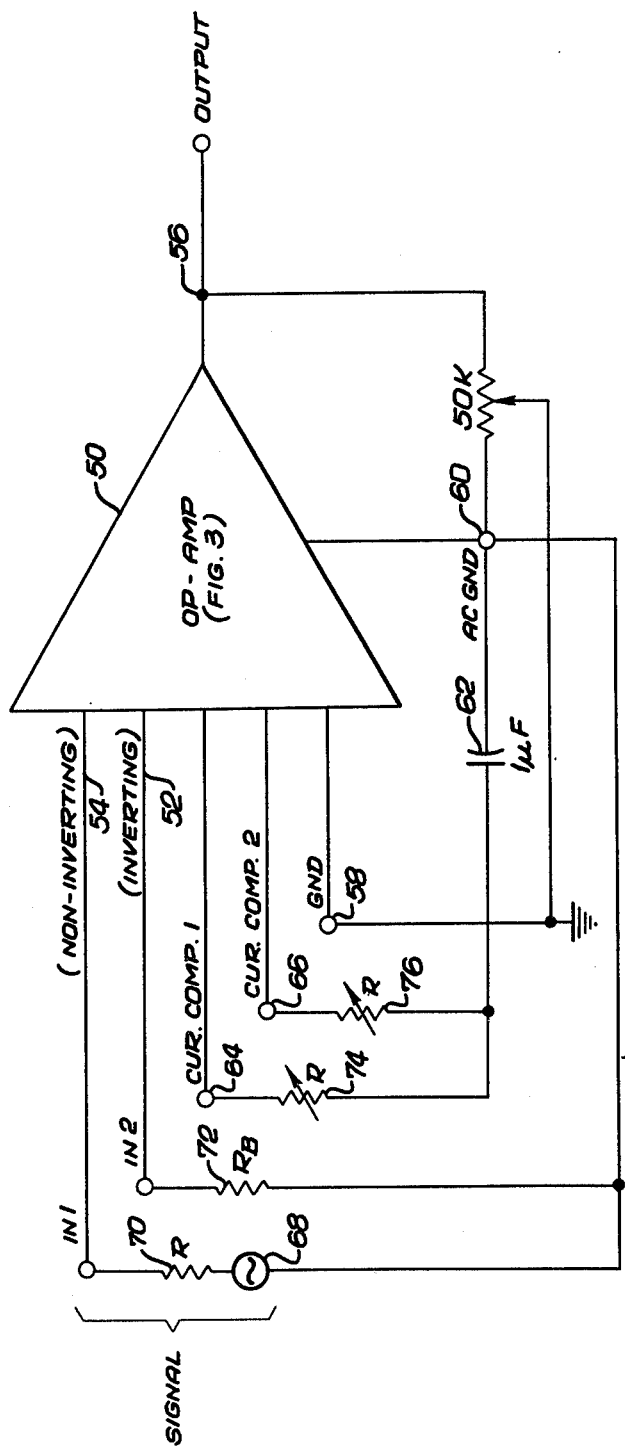
FIG. 2 is a typical interconnection diagram showing how an operational amplifier is connected at its inputs and outputs.

Before considering how the basic cell of the invention may be employed in a complete operational amplifier, it will be useful to first review a typical external interconnection diagram for an amplifier of this type. As shown in FIG. 2, an operational amplifier, indicated by the triangle 50, has an inverting input terminal 42, a non-inverting input terminal 54, and an output terminal 56. It will be understood that some operational amplifiers have differential outputs as well as differential inputs, and the illustration of a single-ended output device is not intended to be a limitation of the invention. The amplifier 50 also has a ground terminal 58, an ac ground terminal 60 coupled to ground through a capacitor 62, and two current compensation terminals 64 and 66.

The input signal is shown as a source generator 68 with a source resistance 70, the generator being connected through the source resistance between the non-inverting input terminal 54 and the ac ground 60. A resistor 72 connected between the inverting input terminal 42 and the ac ground 60 should have a resistance value nominally equal to the Thevenin equivalent circuit source resistance seen by the driven input terminal. Variable resistors 74 and 76 are connected between ground and the respective current compensation terminals 64 and 66, to provide an adjustment for maximum gain and for zero low frequency phase angle between output and input signals. Frequency compensation by means of externally connected capacitors is common in operational amplifiers, but is not shown in FIG. 2 because the specific design of the amplifier contemplates that the capacitors are provided on the same circuit chip as the amplifier circuitry. Optional bonding connections may then be made to the selected capacitors, none of which are shown.

Figure 3:
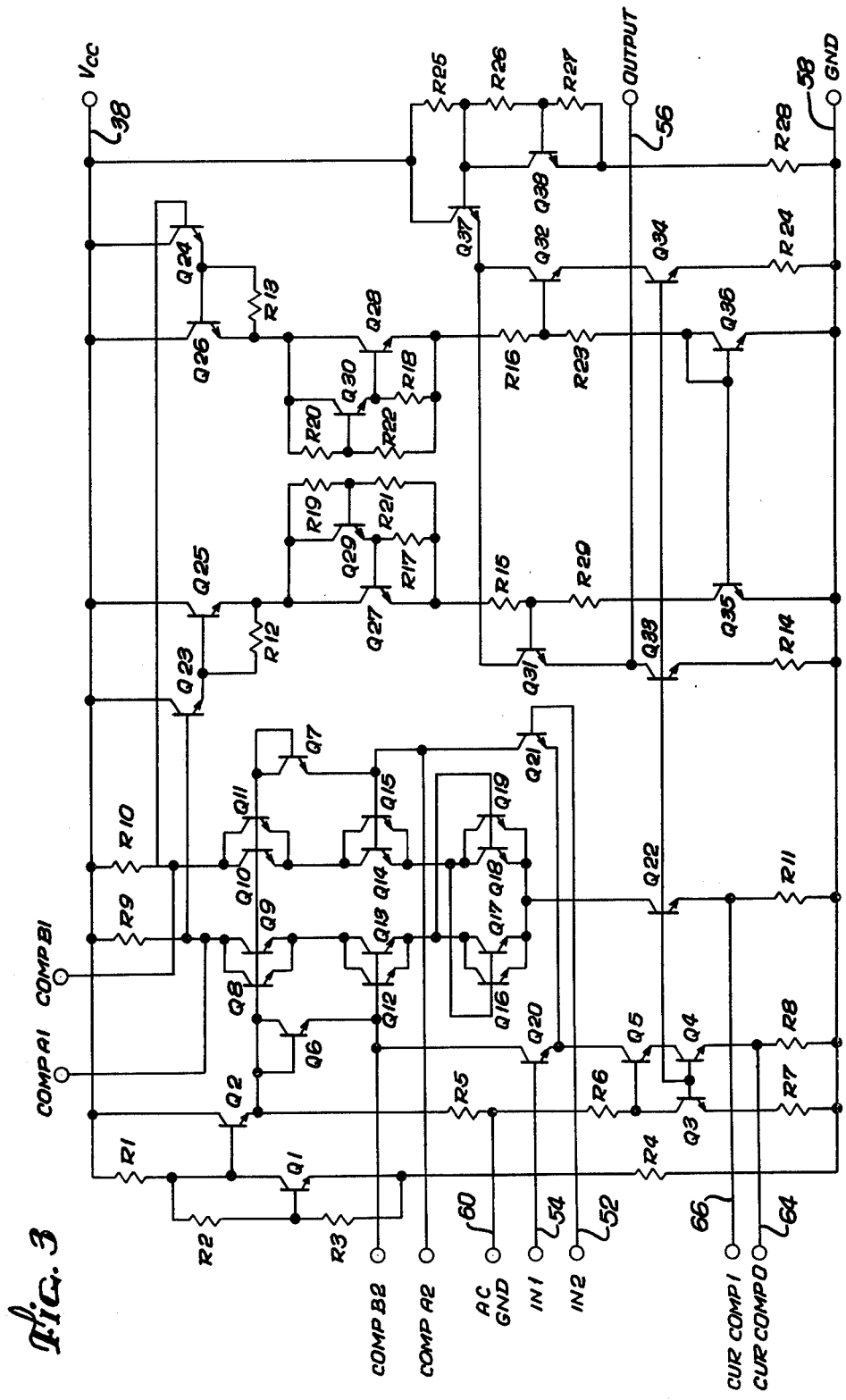
FIG. 3 is a detailed schematic diagram of the operational amplifier of the present invention.

A presently preferred embodiment of the invention is shown in the detailed schematic diagram of FIG. 3. Since most of this circuitry is conventional, it will not be described in detail. However, it will be useful to point out the basic amplifier cell in FIG. 3, and to indicate generally the functions of the other circuit modules of the amplifier.

The first differential transistor pair of the basic amplifier cell comprises transistors Q20 and Q21, these being equivalent to transistors 10 and 12, respectively, in FIG. 1. The second differential transistor pair comprises four transistors Q12–Q15. It will be observed that these transistors are connected in parallel pairs, to equalize current distribution and hence to preclude excessive thermal gradients within the cell. Thus, transistor 14 in FIG. 1 is equivalent to transistors Q12 and Q13 in FIG. 3, and transistor 16 is equivalent to transistors Q14 and Q15.

Similarly, the negative resistance circuit comprising transistors 18 and 20 in FIG. 1 is equivalent to transistors Q16–Q17 and Q18–A19, respectively. The cascode stage of the basic cell, indicated by reference numerals 22 and 24 in FIG. 1, are the transistors Q8–Q11 in FIG. 3. Transistors Q6 and Q7 are connected as diodes and are equivalent to the diodes 34 and 36 in FIG. 1.

Transistor Q22 is current sink performing the function of current generator 28 in FIG. 1, and transistors Q3–Q5 together comprise a frequency compensated current sink equivalent to the generator 26 in FIG. 1. The ratio of the currents in transistors Q22 and Q5 controls the negative resistance of the basic cell, and hence the gain and low frequency characteristics of the operational amplifier. In the circuit shown, transistor Q22 conducts a current of 1.6 milliampere (mA), and transistor Q5 conducts 0.570 mA under balanced conditions. External taps 64 and 66 are provided at the emitters of transistors Q4 and Q22 for fine adjustment of this current ratio. The current sources are thermally compensated by a stabilized reference source comprising transistors Q1 and Q2.

The circuitry including transistors Q23–Q26 is an impedance buffer to transform the output impedance of the basic cell to an acceptable value. The impedance buffer circuitry drives a differential level shifter comprising transistors Q27–Q30. Transistor Q31 provides an emitter follower output voltage extracted from a double-to-single ended converter defined by transistors Q35 and Q36. Transistor Q32 precludes an excessive imbalance on both sides of the level shifter, and transistors Q37 and Q38 supply a stabilized bias for the emitter follower output.

Frequency compensation is implemented by connecting a capacitor between the terminals labeled COMP A1 and COMP A2, and another between the terminals COMP B1 and COMP B2. As mentioned earlier, these capacitors are made available for bonding on the amplifier chip, but of course this has nothing to do with the inventive aspects of the amplifier.

The following are the resistance values in ohms employed in the illustrative circuit of FIG. 3:

| | |
|---|---|
| R1 | 800 |
| R2 | 3.85k |
| R3 | 715 |
| R4 | 1.47k |
| R5 | 1.58k |
| R6 | 845 |
| R7 | 390 |
| R8 | 2.29k |
| R9, R10 | 2k |
| R11 | 610 |
| R12, R13 | 530 |
| R14, R24 | 655 |
| R15, R16 | 180 |
| R17, R18 | 1.26k |
| R21, R22 | 1.56k |
| R19, R20 | 890 |
| R29 | 400 |
| R23 | 1.3k |
| R25 | 1.05k |
| R26 | 1.6k |
| R27 | 780 |
| R28 | 2.1k |

The illustrative amplifier has an open-loop gain of approximately 75dB, and a unity gain frequency of approximately 1.25 GHz. Other characteristics are an input bias current of 1 microampere of less, an input resistance of 200,000 ohms or greater, a common mode rejection ratio of 65dB or greater, an output resistance of 100 ohms or less, and a power dissipation of approximately 265 mW at 12 volts.

It will be appreciated from the foregoing that the present invention represents a significant improvement in the field of operational amplifiers. In particularly, the invention provides an amplifier with a unity gain frequency about five to ten times greater than that of previously available operational amplifiers. It will also be appreciated that, although one embodiment of the invention has been described in detail for purposes of illustration, various modifications to the described circuitry may be made without departing from the spirit and scope of the invention. Accordingly, the invention is not to be limited except as by the appended claims.

I claim:

1. An operational amplifier, comprising:
A first differential pair of transistors connected to receive an input signal across their bases;
A second differential pair of transistors connected to receive as an input across their bases the differential output signal from said first differential pair of transistors, and to supply a differential output signal at their collectors; and
A further pair of transistors having their bases cross-coupled to their collectors, and having their collectors connected to respective emitters of said second differential transistor pair.

2. The operational amplifier of claim 1, further comprising:
A first constant current source connected to the emitter of said first differential transistor pair; and
A second constant current source connected to the emitter of said further pair of transistors.

3. The operational amplifier of claim 1 wherein all of said transistors comprise NPN transistors.

4. The operational amplifier of claim 1, 2 or 3 wherein the emitter resistances of said further pair of transistors are selected to optimize the gain of said amplifier.

5. The operational amplifier of claim 1, 2 or 3 wherein the gain of said amplifier is approximately proportional to the emitter resistances of said further transistor pair.

6. The amplifier of claim 1, 2 or 3 further comprising band-width compensation means connected to the collectors of said second differential transistor pair.

7. The amplifier of claim 1, 2 or 3 further comprising an output pair of transistors having their emitters connected to respective ones of the collectors of said second differential transistor pair, their collectors connected to provide an output signal, their bases being connected through respective diodes to the respective basis of said second differential transistor pair.

8. The operational amplifier of claim 1, 2 or 3 wherein the cross-coupling of said further transistor pair is realized by connecting the base of each transistor of said further transistor pair to the collector of the other transistor of said further transistor pair.

9. An NPN operational amplifier having an extremely high gain-band width product, said amplifier comprising:
A first differential pair of NPN transistors connected to receive an input signal across their bases;
A second differential pair of NPN transistors connected to receive as an input across their bases the differential output signal from said first differential pair of transistors, and supply a differential output signal at their collector; and
A negative resistance circuit connected to the emitters of transistors in said second differential pair, to produce an extremely high amplifier gain, whereby the use of NPN transistors throughout said amplifier maximizes the band width of said circuit, wherein said negative resistance circuit includes:
A further pair of NPN transistors, having their bases cross-coupled to their collectors, and having their collectors connected to respective emitters of said second differential transistor pair.

10. An NPN operational amplifier as set forth in claim 9, and further comprising:
a first constant current source connected to the emitters of said first differential transistor pair; and
a second constant current source connected to the emitters of said NPN transistors in said negative resistance circuit;
and wherein the ratio of the currents generated by said first and second current sources is in part determinative of the value of the negative resistance of said negative resistance circuit.

* * * * *